(12) United States Patent
Takahashi et al.

(10) Patent No.: US 8,916,459 B2
(45) Date of Patent: Dec. 23, 2014

(54) COMPOUND SEMICONDUCTOR DEVICE WITH MESA STRUCTURE

(71) Applicant: Fujitsu Limited, Kawasaki-shi, Kanagawa (JP)

(72) Inventors: Tsuyoshi Takahashi, Kawasaki (JP); Kozo Makiyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/066,730

(22) Filed: Oct. 30, 2013

(65) Prior Publication Data

US 2014/0057401 A1   Feb. 27, 2014

Related U.S. Application Data

(62) Division of application No. 12/180,116, filed on Jul. 25, 2008, now abandoned.

(30) Foreign Application Priority Data

Aug. 28, 2007 (JP) ................. 2007-220821

(51) Int. Cl.

| H01L 21/44 | (2006.01) |
|---|---|
| H01L 29/66 | (2006.01) |
| H01L 29/06 | (2006.01) |
| H01L 29/10 | (2006.01) |
| H01L 29/423 | (2006.01) |
| H01L 29/778 | (2006.01) |
| H01L 21/02 | (2006.01) |

(52) U.S. Cl.
CPC ...... *H01L 29/66462* (2013.01); *H01L 29/0649* (2013.01); *H01L 29/1029* (2013.01); *H01L 29/42316* (2013.01); *H01L 29/7787* (2013.01); *H01L 21/02543* (2013.01); *H01L 21/02587* (2013.01); *H01L 21/0262* (2013.01); *H01L 29/778* (2013.01)
USPC ........... 438/570; 438/167; 438/285; 438/590; 257/E21.068; 257/E21.069

(58) Field of Classification Search
USPC .......... 257/194, 449, 192; 438/570, 572, 474, 438/483
See application file for complete search history.

(56) References Cited

U.S. PATENT DOCUMENTS

| 5,364,816 A | 11/1994 | Boos et al. |
| 5,495,115 A * | 2/1996 | Kudo et al. ................... 257/190 |

(Continued)

FOREIGN PATENT DOCUMENTS

| EP | 0601541 A2 | 6/1994 |
| JP | 05-182991 A | 7/1993 |

(Continued)

OTHER PUBLICATIONS

U.S. Restriction Requirement dated Oct. 4, 2010, issued in related U.S. Appl. No. 12/180,116.

(Continued)

*Primary Examiner* — Steven Loke
*Assistant Examiner* — David Goodwin
(74) *Attorney, Agent, or Firm* — Westerman, Hattori, Daniels & Adrian, LLP (57) ABSTRACT

A compound semiconductor device having mesa-shaped element region, and excellent characteristics are provided. The compound semiconductor device has: an InP substrate; an epitaxial lamination mesa formed above the InP substrate and including a channel layer, a carrier supply layer above the channel layer and a contact cap layer above the carrier supply layer; ohmic source electrode and drain electrode formed on the cap layer; a recess formed by removing the cap layer between the source and drain electrodes, and exposing the carrier supply layer; an insulating film formed on the cap layer and retracted from an edge of the cap layer away from the recess; a gate electrode extending from the carrier supply layer in the recess to outside of the mesa; and air gap formed by removing side portion of the channel layer facing the gate electrode outside the mesa.

7 Claims, 7 Drawing Sheets

(56) References Cited

U.S. PATENT DOCUMENTS

| | | | |
|---|---|---|---|
| 5,702,975 A * | 12/1997 | Yoon et al. | 438/167 |
| 5,733,827 A | 3/1998 | Tehrani et al. | |
| 5,811,843 A | 9/1998 | Yamamoto et al. | |
| 5,869,364 A | 2/1999 | Nakano et al. | |
| 6,057,566 A * | 5/2000 | Eisenbeiser et al. | 257/194 |
| 6,090,649 A | 7/2000 | Suemitsu et al. | |
| 6,294,801 B1 | 9/2001 | Inokuchi et al. | |
| 6,391,696 B1 | 5/2002 | Onda | |
| 6,482,720 B2 * | 11/2002 | Sugino et al. | 438/474 |
| 6,853,016 B2 | 2/2005 | Kobayashi | |
| 7,012,286 B2 | 3/2006 | Inai et al. | |
| 7,573,079 B2 * | 8/2009 | Takahashi | 257/194 |
| 7,618,851 B2 | 11/2009 | Behammer | |
| 7,692,263 B2 | 4/2010 | Wu et al. | |
| 8,183,558 B2 * | 5/2012 | Makiyama et al. | 257/24 |
| 8,633,470 B2 * | 1/2014 | Radosavljevic et al. | 257/18 |
| 2002/0115303 A1 | 8/2002 | Ohta et al. | |
| 2003/0132496 A1 * | 7/2003 | Terano et al. | 257/449 |
| 2005/0068211 A1 | 3/2005 | Arai et al. | |
| 2006/0049427 A1 * | 3/2006 | Takahashi | 257/194 |
| 2007/0267652 A1 | 11/2007 | Amasuga et al. | |
| 2008/0182369 A1 | 7/2008 | Jeong et al. | |

FOREIGN PATENT DOCUMENTS

| | | |
|---|---|---|
| JP | 05-291306 A | 11/1993 |
| JP | 06-232179 A | 8/1994 |
| JP | 2003-218130 A | 7/2003 |
| WO | 03/067764 A1 | 8/2003 |

OTHER PUBLICATIONS

U.S. Non-Final Office Action dated Dec. 9, 2010, issued in related U.S. Appl. No. 12/180,116.

U.S. Final Office Action dated Jun. 10, 2011, issued in related U.S. Appl. No. 12/180,116.

U.S. Non-Final Office Action dated Jan. 16, 2013, issued in related U.S. Appl. No. 12/180,116.

U.S. Final Office Action dated Aug. 1, 2013, issued in related U.S. Appl. No. 12/180,116.

Japanese Office Action dated Aug. 28, 2012, issued in corresponding Japanese Patent Application No. 2007-220821, (4 pages). With English Translation.

* cited by examiner

COMPOUND SEMICONDUCTOR DEVICE WITH MESA STRUCTURE

CROSS REFERENCE TO RELATED APPLICATION

This application is a divisional application of U.S. patent application Ser. No. 12/180,116 filed Jul. 25, 2008, and is based upon and claims the benefits of priority of Japanese Patent Application No. 20007-220821 filed on Aug. 28, 2007, the entire contents of which are incorporated herein by reference.

BACKGROUND

A) Field

The present invention relates to a compound semiconductor device and its manufacture method, and more particularly to a compound semiconductor device such as a high electron mobility transistor (HEMT) using an InP substrate.

B) Description of the Related Art

One type of HEMT using an InP substrate has a structure that after a buffer layer, a channel (electron transfer) layer and a carrier (electron) supply layer are laminated on an InP substrate, a cap layer for contact is formed, the cap layer under a gate electrode is removed, and a T type gate electrode is formed on the carrier supply layer. In order to retain adhesion between the compound semiconductor layer surface and a resist layer, it is desired to form an insulating film on the compound semiconductor surface.

JP-A-HEI-6-232179 discloses a method and structure that an insulating film is laminated on a cap layer, an opening is formed through the insulating layer, and that the cap layer is wet-etched via the opening to form a gate electrode.

Figure 5A:
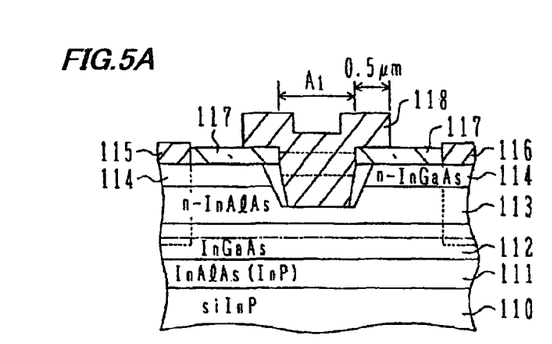
FIGS. 5A to 5E are cross sectional views of a semiconductor substrate showing a compound semiconductor device and illustrating main processes of a manufacture method according to the prior art.

The structure shown in FIG. 5A is formed by manufacture processes illustrated in FIGS. 5B to 5E.

Figure 5B:
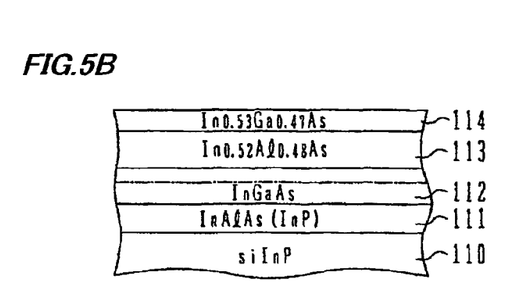

As shown in FIG. 5B, by molecular beam epitaxy (MBE) or organic metal vapor phase epitaxy (OMVPE), on a semi-insulating InP substrate 110, a buffer layer 111 of non-doped InP or InAlAs lattice-matching with InP is grown to a thickness of about 300 nm, a channel layer 112 of InGaAs is grown on the buffer layer 111 to a thickness of about 15 nm, an electron supply layer 113 of $In_{0.52}Al_{0.48}As$ having an electron concentration of $5\times10^{18}/cm^3$ is grown on the channel layer 112 to a thickness of 40 nm, and a cap layer 114 of $In_{0.53}Ga_{0.47}As$ having an electron concentration of $5\times10^{18}/cm^3$ is grown on the electron supply layer 113 to a thickness of 10 nm. The channel layer 112 may be made of InP.

Figure 5C:
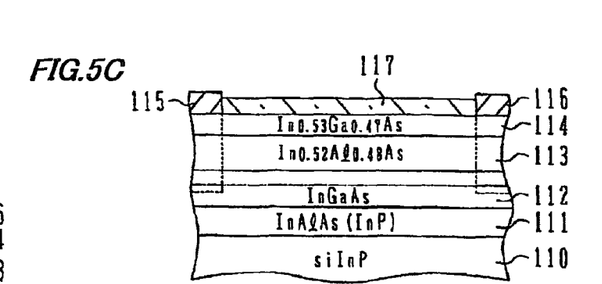

As shown in FIG. 5C, drain/source ohmic electrodes 115 and 116 are formed in predetermined areas on the cap layer 114 by vapor deposition, and an alloying process is executed to form high concentration n-type regions under the ohmic electrodes 115 and 116. Next, by plasma CVD, an SiN insulating film 117 is deposited to a thickness of about 50 to 100 nm. This insulating film may be made of insulating material capable of being formed at a lower temperature than SiN, such as $SiO_2$ and SiON.

Figure 5D:
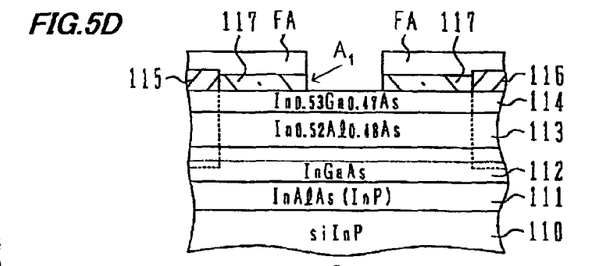

As shown in FIG. 5D, a photoresist mask FA having an opening is formed by photolithography, and by using the photoresist film FA as an etching mask, the insulating film 117 is etched and removed from the region where an opening $A_1$ is to be formed. This opening $A_1$ functions as a mask when recess-etching to be described later is performed, and defines a channel length and a channel width of the gate electrode. After the opening $A_1$ is formed, the photoresist film FA is removed.

Figure 5E:
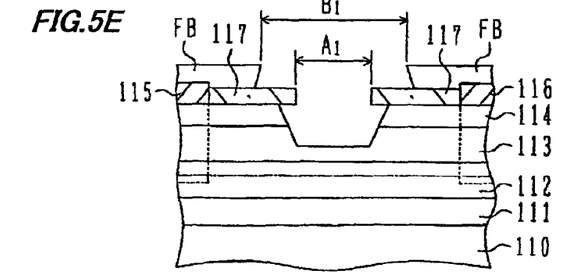

As shown in FIG. 5E, a photoresist film FB is formed by photolithography, having an opening $B_1$ being inclusive of the opening $A_1$ and broader than the opening $A_1$. After the photoresist film FB is formed, by using the insulating film 117 as a mask, the cap layer 114 is recess-etched to form a recess in the cap layer 114, the recess being broader than the opening $A_1$ of the insulating film 117. This recess-etching may use etchant of aqueous solution of phosphoric acid and aqueous solution of hydrogen peroxide. A recess structure is also formed in the electron supply layer 113.

Next, Ti/Pt/Au are sequentially vapor-deposited to thicknesses of 50/50/500 nm, respectively. The unnecessary photoresist FB is removed by lift-off to form a Schottky gate electrode 118 shown in FIG. 5A. The Schottky gate electrode 118 is formed in a rectangular shape along the opening $A_1$ of the insulating film 117, and does not contact the cap layer 114 although it contacts the electron supply layer 113. The opening $A_1$ is hermetically sealed by the Schottky gate electrode 118 and an inner gap of the recess structure is shielded perfectly from an external atmosphere.

According to the structure and manufacture method illustrated in FIGS. 5A to 5E, the SiN film used as a mask for recess-etching regulates a layout of the gate electrode. The gate electrode cannot be made nearer to the side edge of the cap layer than the opening position of the SiN film. The recess structure is symmetrical relative to the gate electrode, and a drain offset structure cannot be realized, which structure lowers the source resistance and improves a drain breakdown voltage by making the gate electrode near to the source electrode and remoter from the drain electrode. If a resist pattern is formed directly on the cap layer, adhesion of resist is bad and wet-etching liquid permeates into the interface. Wet-etching cannot be performed at a high precision.

International Publication WO 03/067764 proposes that a dummy pattern of phosphosilicate glass (PSG) or the like is formed on a cap layer, an SiN film is deposited on the dummy pattern, an opening is formed through the SiN film, having a shape that a gate electrode is to be accommodated and reaching the cap layer at asymmetric positions relative to the source and drain, the dummy pattern is etched via the opening, and the cap layer under the area from which the dummy pattern was removed is etched to thereby realize the drain offset structure. Similar to JP-A-HEI-6-232179, the SiN film of a hood shape exists above the cap layer, and the gate electrode contacts the SiN film. Although the drain offset structure can be realized, the layout or disposal of the gate electrode is limited by the hood structure of the SiN film, and parasitic capacitance is formed between the gate electrode and the SiN film of the hood shape.

SUMMARY OF THE INVENTION

According to one aspect of the present invention, there is provided a compound semiconductor device including:

an InP substrate;

a mesa formed above the InP substrate by an epitaxial lamination and including a channel layer, a carrier supply layer above the channel layer and a contact cap layer above the carrier supply layer;

a pair of ohmic electrodes formed on the cap layer and including a source electrode and a drain electrode;

a recess formed by removing the cap layer between the pair of ohmic electrodes, and exposing the carrier supply layer;

an insulating film formed on the cap layer and retracted from an edge of the cap layer toward a direction away from the recess;

a gate electrode extending from the carrier supply layer in the recess to an outside of the mesa; and an air gap formed by removing a side portion of the channel layer facing a portion of the gate electrode outside the mesa.

DESCRIPTION OF THE PREFERRED EMBODIMENTS

Embodiments of the present invention will now be described with reference to the accompanying drawings.

FIGS. 1A to 1L are cross sectional views of a semiconductor substrate illustrating main processes of a method for manufacturing a compound semiconductor device according to a first embodiment, and FIGS. 2A to 2D are schematic plan views of a semiconductor substrate showing examples of plan shapes of a resist pattern to be used by the manufacture processes.

Figure 1A:
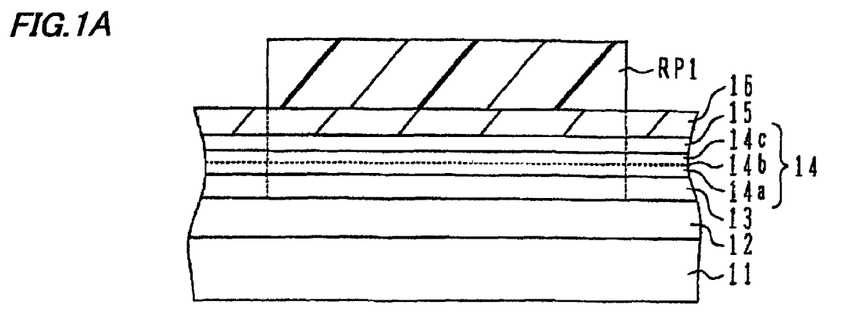
FIGS. 1A to 1L are cross sectional views of a semiconductor substrate illustrating main processes of a method for manufacturing a compound semiconductor device according to an embodiment.

As shown in FIG. 1A, grown on a semi-insulating (si) InP substrate 11 by metal organic vapor phase epitaxy or chemical vapor deposition (MOCVD) are an i-InAlAs buffer layer 12 having a thickness not thinner than 50 nm, an i-InGaAs channel layer 13 having a thickness not thinner than 5 nm, an i-InAlAs spacer layer 14a, a planar doping 14b of $5 \times 10^{12}$ cm$^{-2}$, an i-InAlAs barrier layer 14c, an InP etch stopper layer 15 having a thickness of 2 nm to 6 nm, and an n-InGaAs contact cap layer 16 having a thickness of e.g., 50 nm. Although a thickness upper limit of the buffer layer 12 and channel layer 13 is not specifically defined, a practical thickness upper limit may be 3 μm. The i-InAlAs spacer layer 14a, planar doping 14b of $5 \times 10^{12}$ cm$^{-2}$ and i-InAlAs barrier layer 14c may be considered collectively as a carrier supply layer 14. A thickness of the carrier supply layer 14 is 5 nm to 30 nm, the i-InAlAs spacer layer 14a has a thickness of, e.g., 3 nm and the i-InAlAs barrier layer 14c has a thickness of, e.g., 6 nm. The carrier supply layer 14 may be a lamination of the i-InAlAs spacer layer 14a and n-InAlAs layer 14c. A carrier concentration of the n-InGaAs cap layer 16 is $1 \times 10^{18}$ cm$^{-3}$ to $1 \times 10^{20}$ cm$^{-3}$, e.g., $1 \times 10^{19}$ cm$^{-3}$. The InP etch stopper layer 15 may be omitted.

Source gases used for MOCVD are, for example, trimethylindium (TMIn) for In, trimethylaluminum (TMAl) for Al, triethylgallium (TEGa) for Ga, arsine (AsH$_3$) for As, phosphine (PH$_3$) for P, and silane (SiH$_4$) or disilane (Si$_2$H$_6$) for n-type impurity Si.

A resist pattern RP1 for defining active regions is formed on the n-InGaAs cap layer 16 by photolithography.

Figure 2A:
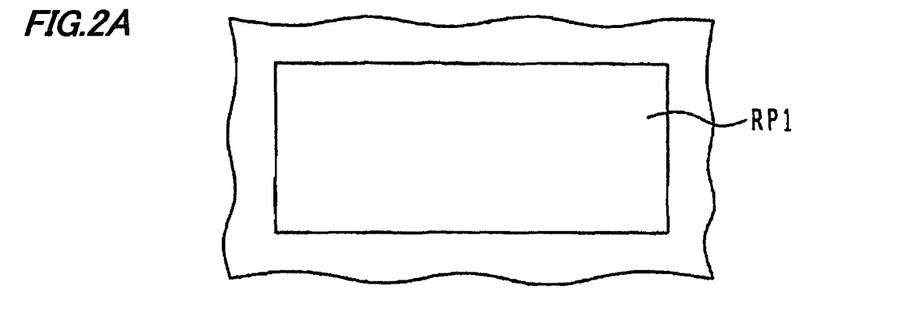
FIGS. 2A to 2D are plan views showing examples of plan shapes of a resist pattern to be used by the method for manufacturing a semiconductor device according to the embodiment.

FIG. 2A shows examples of a plan shape of the resist pattern RP1. The resist pattern RP1 of a rectangular shape defines the active region, and the exposed region in a circumference area is the isolation region. The size of the active region is, for example, as follows. A length along a source/drain direction, i.e., along a right/left direction in FIG. 2A is 10 μm, and a width along a gate width direction, i.e., along a vertical direction in FIG. 2A is 50 μm. For the purposes of drawing convenience, the vertical direction is drawn in a reduced scale.

Reverting to FIG. 1A, by using the resist pattern RP1 as an etching mask, the epitaxial lamination is wet-etched down to the channel layer 13 inclusive by mixture liquid of phosphoric acid and aqueous solution of hydrogen peroxide. The intermediate InP etch stopper layer 15 can be removed by mixture liquid of hydrochloric acid and phosphoric acid. The resist pattern RP1 is thereafter removed.

Figure 1B:
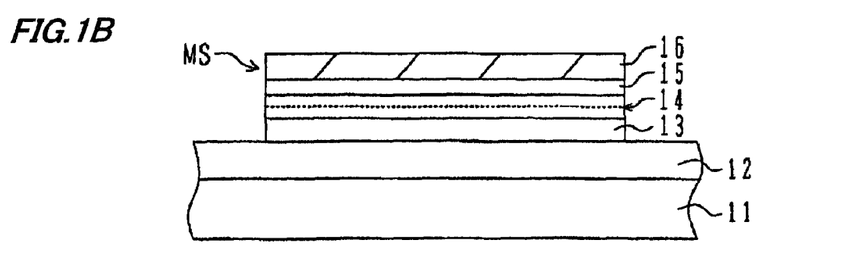

As shown in FIG. 1B, an element region mesa (MS) is therefore formed which is constituted of the i-InGaAs channel layer 13, InAlAs carrier supply layer 14, InP etch stopper layer 15 and n-InGaAs cap layer 16.

Figure 1C:
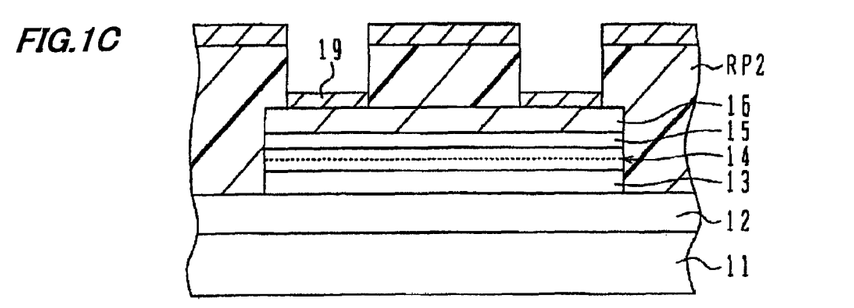

As shown in FIG. 1C, a resist pattern RP2 is formed on the n-InGaAs cap layer 16, the resist pattern RP2 being used for forming a source electrode and a drain electrode by lift-off.

Figure 2B:
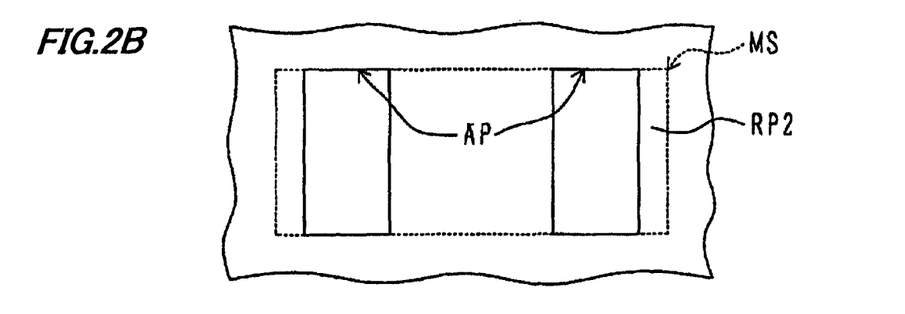

FIG. 2B shows a plan shape of the resist pattern RP2. The resist pattern having two rectangular openings or apertures AP is therefore formed on the mesa MS. The openings AP for defining the source/drain electrodes have a size of, e.g., 3 μm×50 μm, and disposed facing apart by 2 μm.

Reverting to FIG. 1C, for example, a Ti layer of 10 nm thick, a Pt layer of 50 nm thick and an Au layer of 300 nm thick are deposited on the n-InGaAs cap layer 16 in this order from the substrate by vapor deposition, to thereby form an ohmic electrode layer 19. The metal layer on the resist pattern RP2 is removed together with the resist pattern RP2 by lift-off to leave ohmic electrodes 19. The electrodes on InGaAs can provide ohmic characteristics without alloying process (non-alloy).

Figure 1D:
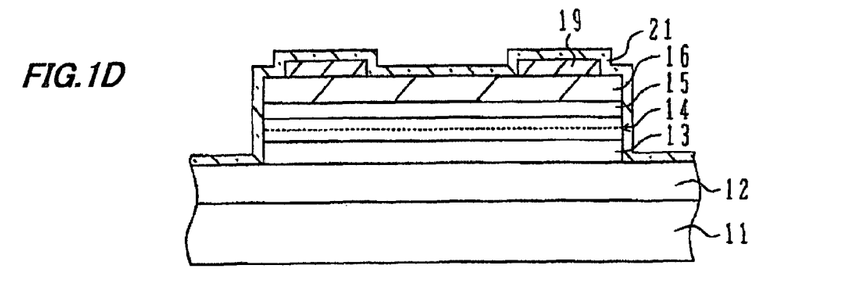

As shown in FIG. 1D, an insulating film 21 is deposited by plasma CVD, covering the mesa MS formed with the ohmic electrodes 19. The insulating film 21 is, for example, an SiN film having a thickness of 10 nm to 50 nm, e.g., 20 nm.

Figure 1E:
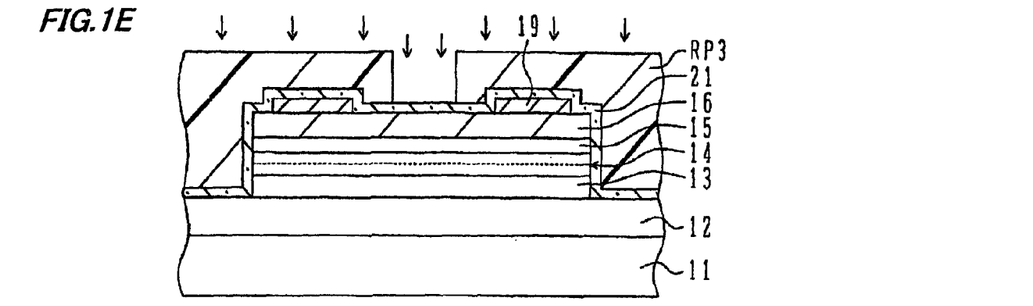

As shown in FIG. 1E, a resist pattern RP3 is formed on the insulating film 21 by photolithography or EB lithography, the resist pattern RP3 having an opening for recess-etching.

Figure 2C:
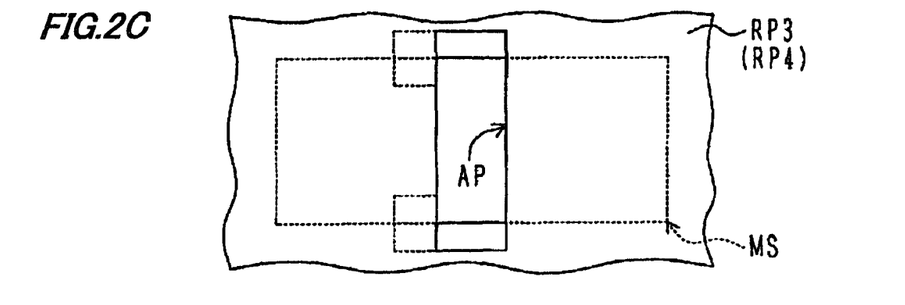

FIG. 2C shows a plan shape of the resist pattern RP3. A rectangular opening AP is formed through the resist pattern, traversing the mesa MS and reaching steps at opposite ends.

Revering to FIG. 1E, by using the resist pattern RP3 as an etching mask, the insulating film 21 exposed in the opening is removed by dry etching using SF$_6$ or CF$_4$ as etchant.

Figure 1F:
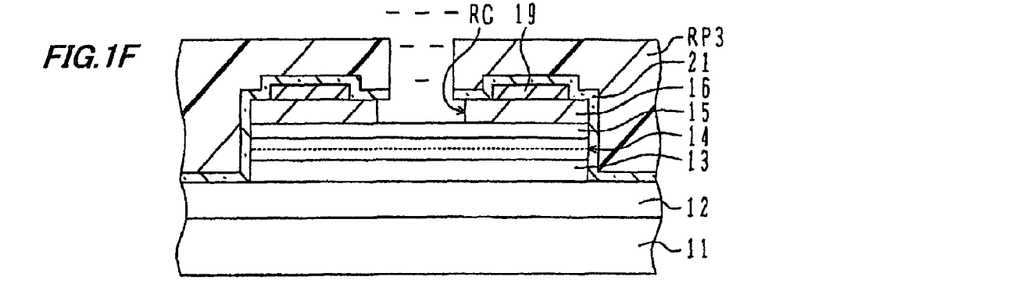

As shown in FIG. 1F, by using the resist pattern RP3 and etched insulating film 21 as a mask, the n-InGaAs cap layer 16 is selectively etched by wet etching using mixture liquid of phosphoric acid, aqueous solution of hydrogen peroxide and water. The InP etch stopper layer 15 functions as an etch stopper. The n-InGaAs cap layer 16 is side-etched to form a recess RC having a width wider than the opening of the insulating film 21. The i-InGaAs channel layer 13 is not etched. The resist pattern RP3 is thereafter removed. The insulating film 21 projects in a hood shape from the edge of the n-InGaAs cap layer 16.

Figure 1G:
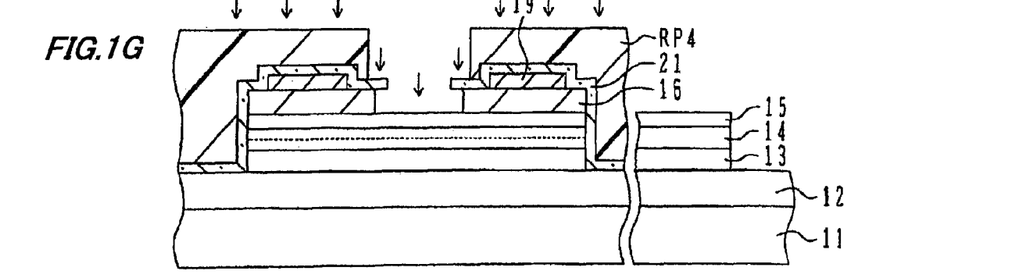

As shown in FIG. 1G, a resist pattern RP4 is newly formed having a broader opening width and exposing the hood of the insulating film 21. By using the resist pattern RP4 as a mask, the insulating film 21 exposed in the opening is removed by dry etching using $SF_6$ or $CF_4$ as etchant. A mesa edge portion exposed in an opening is shown to the right in FIG. 1G.

Although the inner surface of the recess is exposed to plasma of dry etching, the mesa edges change hardly, and only the exposed portion of the insulating film 21 including the hood is removed. Without using the resist pattern RP4, dry etching may be performed for the whole substrate surface to remove the whole insulating film 21. The resist pattern RP4 is thereafter removed.

Figure 1H:
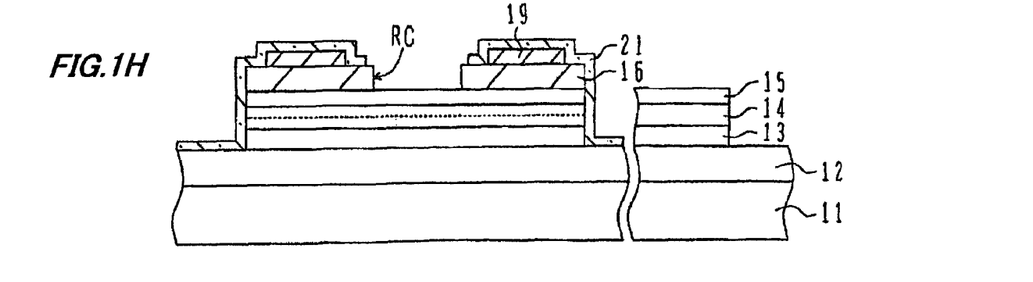

FIG. 1H shows a state that the resist pattern RP4 is removed. The recess RC is formed in the cap layer 16, the insulating film 21 is left only at the position retracted from the recess edges of the cap layer 16, and the hood disappears. The gate electrode can be formed in the recess at a desired position. However, if the gate electrode traversing the mesa MS is formed in this state, the gate electrode and channel layer 13 may contact with each other.

Figure 1I:
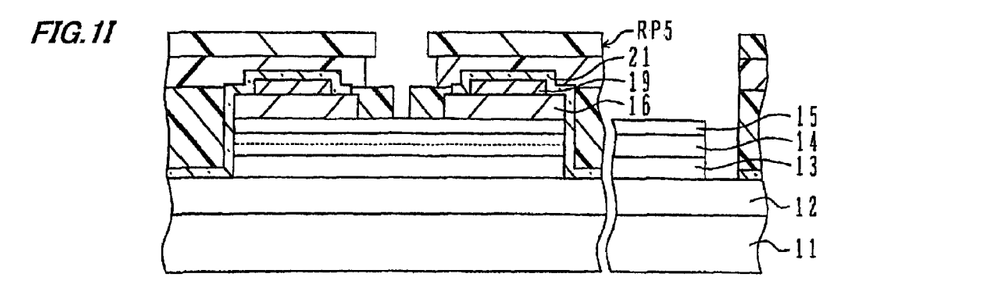

As shown in FIG. 1I, a three-layered EB resist pattern RP5 is formed for gate electrode formation. A three-layered resist layer is coated. An opening for defining a wider portion of a T-type gate electrode is formed through the uppermost layer by EB exposure and development, a wider space is formed through the intermediate layer, and an opening for defining a gate length (channel length) of the gate electrode is formed through the lowermost layer by EB exposure and development. This opening is several ten nm to several hundred nm wide, e.g., 0.1 µm wide.

Figure 2D:
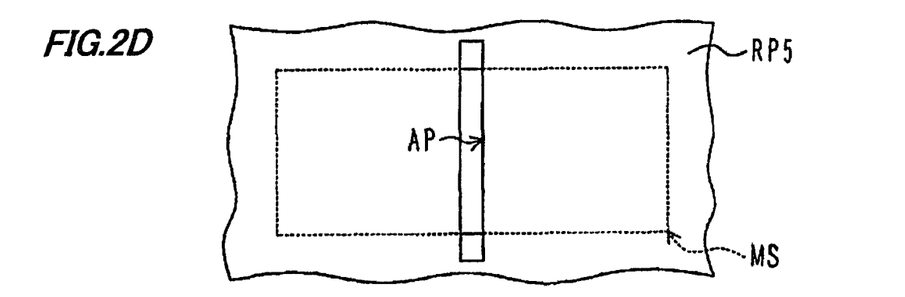

FIG. 2D is a plan view showing the shape of the opening of the lowermost layer. A rectangular opening AP of about 0.1 µm length is formed traversing the mesa MS and extending to the steps.

Figure 1J:
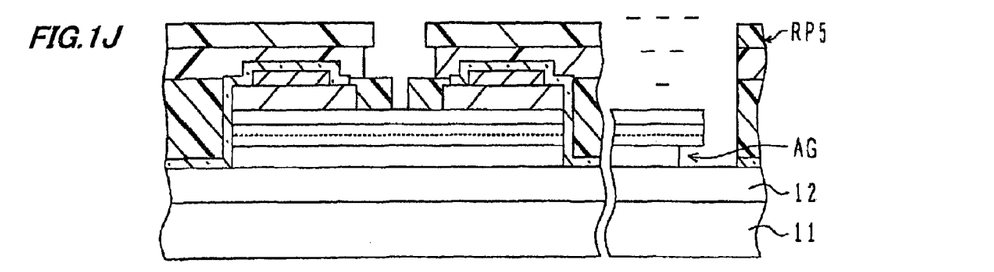

As shown in FIG. 1J, mixture liquid of citric acid, aqueous solution of hydrogen peroxide and water is allowed to enter the opening to side-etch the i-InGaAs channel layer 13. The side wall of the i-InGaAs channel layer 13 retracts from the mesa side surface to form an air gap AG.

It can be considered that the air gap AG may be formed at stages shown in FIGS. 1A and 1F. However, after the air gap AG is formed at these stages, as the insulating film 21 exposed in the opening shown in FIG. 1G is dry-etched, the carrier supply layer 14 on the channel layer 13 was extinguished in some cases. It is therefore desired to form the air gap AG after the insulating film 21 exposed in the opening is dry-etched.

Figure 1K:
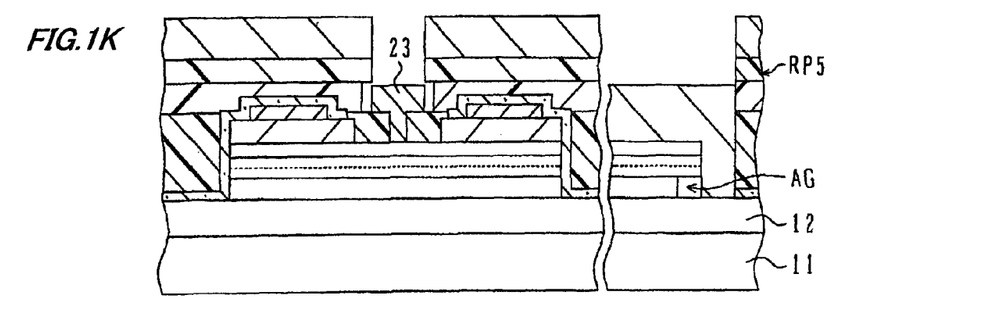

As shown in FIG. 1K, for example, a Ti layer of 10 nm thick, a Pt layer of 50 nm thick and an Au layer of 500 nm thick are vapor-deposited on the substrate from the upside, and a gate electrode 23 is formed by lift-off. The gate electrode 23 is a T-type gate in which a length (channel length) of the stem contacting the semiconductor layer along the current direction is short to enhance a high speed operation, and a length of the upper portion along the current direction is elongated to lower resistance.

Figure 1L:
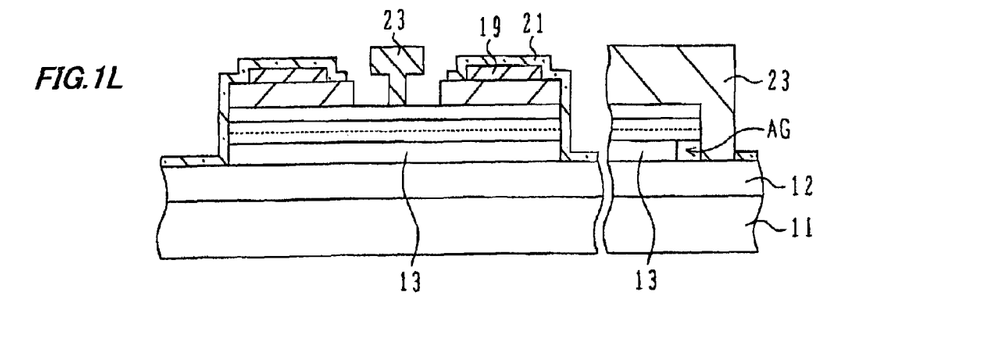

FIG. 1L shows a state that the resist pattern RP5 is removed. The gate electrode 23 and channel layer 13 are separated by the air gap AG.

In the embodiment described above, by utilizing the resist pattern having a rectangle opening for gate electrode formation, etchant is allowed to enter the opening and side-etch the channel layer 13. If an opening width is narrow, the etchant may not be supplied sufficiently.

Figure 3A:
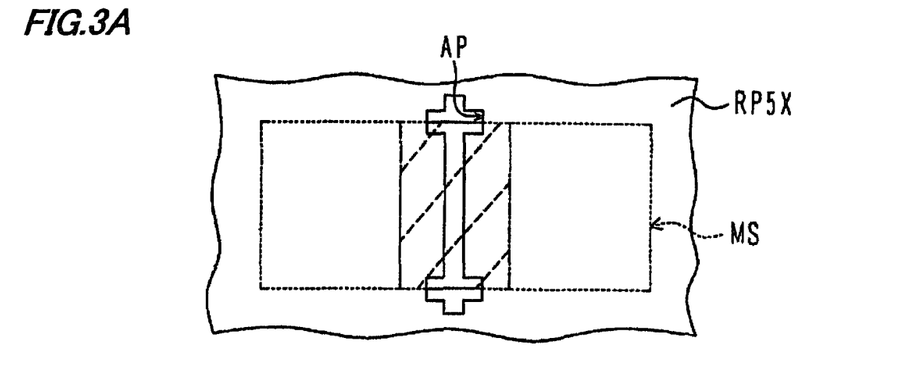
FIGS. 3A to 3C are plan views showing modifications of a resist pattern shape for a gate electrode.

As shown in FIG. 3A, a width of the opening of a resist pattern RP5X for gate electrode formation may be broadened in the neighborhood of the mesa MS edge to allow etchant be supplied sufficiently. In FIG. 3A, the portion near the mesa edge is broadened in a cross shape. It becomes possible to supply etchant easily, side-etch the channel layer and reliably form the air gap.

Figure 3B:
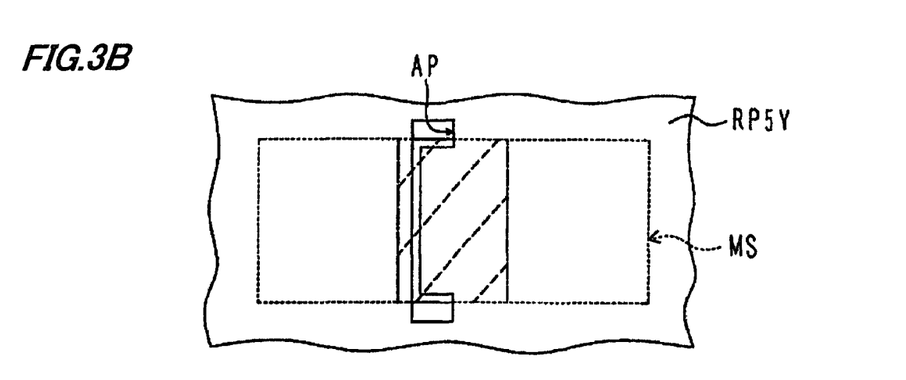

As shown in FIG. 3B, in the case of a drain offset gate having the gate electrode shifted toward the source electrode, if an opening AP of a resist pattern RP5Y for gate electrode formation is broadened on both sides, the cap layer on the source side and the gate electrode may be electrically shortened. In this case, the opening AP of the resist pattern RP5Y for gate electrode formation may be broadened only on the drain side near the mesa edge. The shape of the gate electrode, however, becomes asymmetric.

Figure 3C:
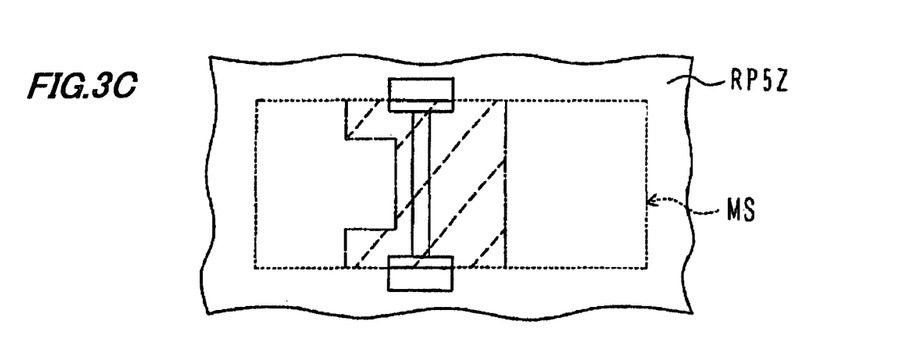

As shown in FIG. 3C, a shape of the cap layer on the source side may be cut away near the mesa edge to broaden the opening of a resist pattern RP5X for gate electrode formation so that electrical short does not occur between the gate electrode and the cap layer on the source side. In this case, an opening shape of the resist pattern RP3 (RP4) shown in FIG. 2C is modified to project near the mesa edge as indicated by broken lines to become coincident with the intended recess shape. Even if the gate electrode is shifted toward the source electrode, a gate electrode of a symmetric shape can be formed.

By using the resist patterns shown in FIGS. 3A, 3B and 3C, a width of the gate electrode in a gate length direction becomes partially wide near the mesa edge. Although this structure increases capacitance of the gate electrode, this increase amount is about 2% for standard devices, and influence upon the total operation characteristics is less.

In the structure shown in FIG. 1L, a semiconductor surface is exposed near the gate electrode. It may be desired in some cases to passivate the whole exposed semiconductor surface with an insulating protection film.

Figure 4A:
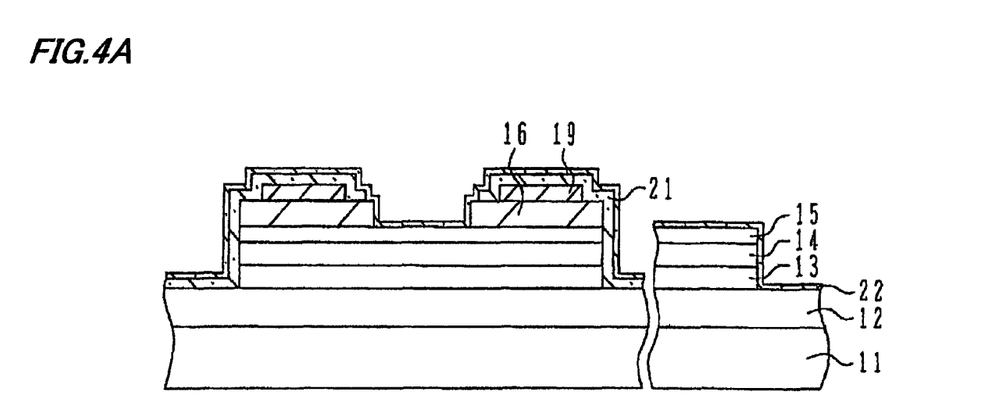
FIGS. 4A and 4B are cross sectional views of a semiconductor substrate illustrating modifications of the method for manufacturing a semiconductor device according to the embodiment.

As shown in FIG. 4A, after the hood of the insulating film 21 is removed by the processes in FIGS. 1A to 1H, an insulating film 22 covering the recess surface may be formed. For example, a SiN film having a thickness of 10 nm to 50 nm, e.g., 20 nm, is deposited by plasma CVD.

Figure 4B:
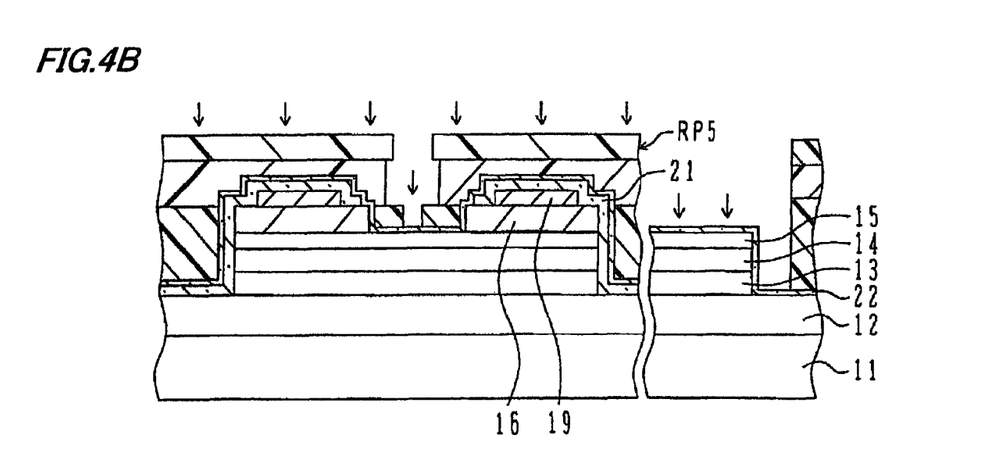

As shown in FIG. 4B, a gate electrode resist pattern RP5 is formed on the insulating film 22 by a process similar to that shown in FIG. 1I. By using the resist pattern RP5 as a mask, the insulating film 22 exposed in the opening is etched and removed by dry etching using $SF_6$ or $CF_4$. Thereafter, side etching for air gap formation and a gate electrode forming process are executed in a manner similar to the above-described embodiment.

The present invention has been described in connection with the preferred embodiments. The invention is not limited only to the above embodiments. It will be apparent to those skilled in the art that other various substitutions, modifications, improvements, combinations, and the like can be made.

What are claimed are:

1. A method for manufacturing a compound semiconductor device, comprising steps of:
   (A) growing an epitaxial lamination above an InP substrate, said epitaxial lamination including a channel layer, a carrier supply layer and a contact cap layer in this order from a lower level, and etching said contact cap layer, said carrier supply layer and said channel layer to form a mesa, the mesa having a side surface exposing side surfaces of the contact cap layer, the carrier supply layer, and the channel layer;
   (B) forming a pair of ohmic electrodes on said contact cap layer, said pair of ohmic electrodes being a source electrode and a drain electrode;
   (C) forming an insulating film on said contact cap layer, said insulating film covering said source electrode and said drain electrode, and forming an opening in the insulating film by dry-etching said insulating film between said pair of ohmic electrodes;

(D) selectively wet-etching said contact cap layer via said opening to form a recess broader than said opening in the insulating film and to expose said carrier supply layer;
(E) etching and removing a portion of said insulating film at least in an area located above said recess;
(F) forming a resist pattern traversing said mesa, the resist pattern having a gate electrode opening exposing the side surface of said mesa;
(G) side-etching said channel layer exposed at the side surface of said mesa via said gate electrode opening by wet etching to form an air gap portion; and
(H) forming a metal layer on a semiconductor surface exposed in said gate electrode opening and on said resist pattern, performing lift-off to form a gate electrode extending from said carrier supply layer to outside of said mesa.

2. The method for manufacturing a compound semiconductor device according to claim 1, wherein said step (D) uses mixture liquid of phosphoric acid, aqueous solution of hydrogen peroxide, and water and said step (G) uses mixture liquid of citric acid, aqueous solution of hydrogen peroxide, and water.

3. The method for manufacturing a compound semiconductor device according to claim 1, further comprising steps of:

(I) forming another insulating film on said mesa between said steps (E) and (F), said another insulating film covering a surface of said recess; and
(J) etching and removing said another insulating film exposed in said gate electrode opening between said steps (F) and (G).

4. The method for manufacturing a compound semiconductor device according to claim 1, wherein said gate electrode opening is disposed in said recess in such a manner that said gate electrode is nearer to said source electrode than to said drain electrode.

5. The method for manufacturing a compound semiconductor device according to claim 1, wherein said gate electrode opening has a broadened width along current flow direction outside edges of said channel layer.

6. The method for manufacturing a compound semiconductor device according to claim 5, wherein said opening has a shape surrounding a portion of the gate electrode opening having the broadened width of said gate electrode.

7. The method for manufacturing a compound semiconductor device according to claim 1, wherein said step (A) growing is by MOCVD.

* * * * *